(12) United States Patent
Ahrens et al.

(10) Patent No.: US 7,307,329 B2
(45) Date of Patent: Dec. 11, 2007

(54) ELECTRONIC DEVICE WITH GUARD RING

(75) Inventors: Cartens Ahrens, Munich (DE); Ulf Bartl, Munich (DE); Bernd Eisener, Hohenbrunn (DE); Wolfgang Hartung, Munich (DE); Christian Herzum, Poecking (DE); Raimund Peichl, Hoehenkirchen (DE); Stefan Pompl, Altdorf (DE); Hubert Werthmann, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/887,244

(22) Filed: Jul. 8, 2004

(65) Prior Publication Data
US 2005/0035423 A1 Feb. 17, 2005

(30) Foreign Application Priority Data
Jul. 8, 2003 (DE) ................. 103 30 838

(51) Int. Cl.
*H01L 29/47* (2006.01)
*H01L 21/28* (2006.01)
(52) U.S. Cl. ................. 257/483; 257/484; 257/E21.45; 257/E29.32; 257/E29.265; 257/E31.76; 438/570
(58) Field of Classification Search ................. 257/483, 257/484; 438/570
See application file for complete search history.

(56) References Cited

U.S. PATENT DOCUMENTS

| | | | |
|---|---|---|---|
| 3,820,235 A | * | 6/1974 | Goldman .................... 438/492 |
| 3,907,617 A | | 9/1975 | Zwernemann |
| 4,063,964 A | | 12/1977 | Peressini et al. |
| 4,209,349 A | | 6/1980 | Ho et al. |
| 4,209,350 A | | 6/1980 | Ho et al. |
| 4,261,095 A | | 4/1981 | Dreves et al. |
| 4,414,737 A | * | 11/1983 | Menjo et al. ................ 438/564 |
| 4,626,884 A | * | 12/1986 | Shannon ..................... 257/452 |
| 4,691,435 A | | 9/1987 | Anantha et al. |
| 4,796,069 A | | 1/1989 | Anantha et al. |
| 4,922,316 A | * | 5/1990 | Sato ........................... 257/380 |
| 5,418,185 A | | 5/1995 | Todd et al. |
| 5,696,025 A | * | 12/1997 | Violette et al. ............. 438/570 |
| 5,907,179 A | | 5/1999 | Losehand et al. |
| 6,013,936 A | * | 1/2000 | Colt, Jr. ...................... 257/506 |
| 6,060,757 A | | 5/2000 | Losehand et al. |

(Continued)

FOREIGN PATENT DOCUMENTS

JP 3-227066 * 10/1991

(Continued)

*Primary Examiner*—A. Sefer
(74) *Attorney, Agent, or Firm*—Maginot Moore & Beck (57) ABSTRACT

An electronic device includes a substrate, an insulating layer arranged on the substrate, the insulating layer having an opening in an area of the surface of the substrate, an active layer arranged within the opening on the surface of the substrate, the active layer including a guard ring in those areas of the surface and of the active layer which are adjacent to the insulating layer, and a contacting layer arranged on an area of the active layer, the contact layer being adjacent to an area of the guard ring. The device may be produced by a process of three-fold self-alignment, to be precise utilizing a spacer process by means of which a diffusion source having a lateral extension far below the lithography limit is made possible.

10 Claims, 7 Drawing Sheets

U.S. PATENT DOCUMENTS

| | | |
|---|---|---|
| 6,191,015 B1 | 2/2001 | Losehand et al. |
| 6,597,050 B1 * | 7/2003 | Dunn et al. ................. 257/453 |
| 2001/0042862 A1 * | 11/2001 | Epke .......................... 257/54 |
| 2003/0137869 A1 * | 7/2003 | Kozicki ...................... 365/158 |
| 2004/0070002 A1 * | 4/2004 | Kurosaki et al. ........... 257/127 |
| 2005/0077590 A1 * | 4/2005 | Swanson et al. ............ 257/484 |

FOREIGN PATENT DOCUMENTS

| | | |
|---|---|---|
| JP | 5-343660 | * 12/1993 |

* cited by examiner

ELECTRONIC DEVICE WITH GUARD RING

BACKGROUND OF THE INVENTION

1. Field of the Invention

The present invention relates to an electronic device, and in particular to an electronic device implemented in integrated technology.

2. Description of Prior Art

For utilization in switching circuits of high-frequency and/or maximum-frequency technology, devices having a highly non-linear characteristic curve are often required. Here, a semiconductor metal contact whose semiconductor material is not too highly doped is advantageous, in particular, since such a contact exhibits the highly non-linear characteristic curve necessary for circuit design. Such a semiconductor metal contact, which is also referred to as Schottky diode, therefore is suitable, due to the highly non-linear diode characteristic curve, in particular as a rectifier element with extremely high frequencies and as a majority carrier device, since the stored-charge effects caused by minority carriers are insignificant.

A fundamental problem associated with Schottky diodes is the occurrence of parasitic currents beyond the edge area of the diode. The parasitic current here results from a superposition of several different conducting mechanisms as are illustrated, by way of example, in FIG. 2.

However, such conducting mechanisms do not only occur with Schottky diodes but also with other devices. Without limiting the general applicability, the description that follows will show, using the example of a Schottky diode, the conducting mechanisms leading to parasitic currents.

Figure 2:
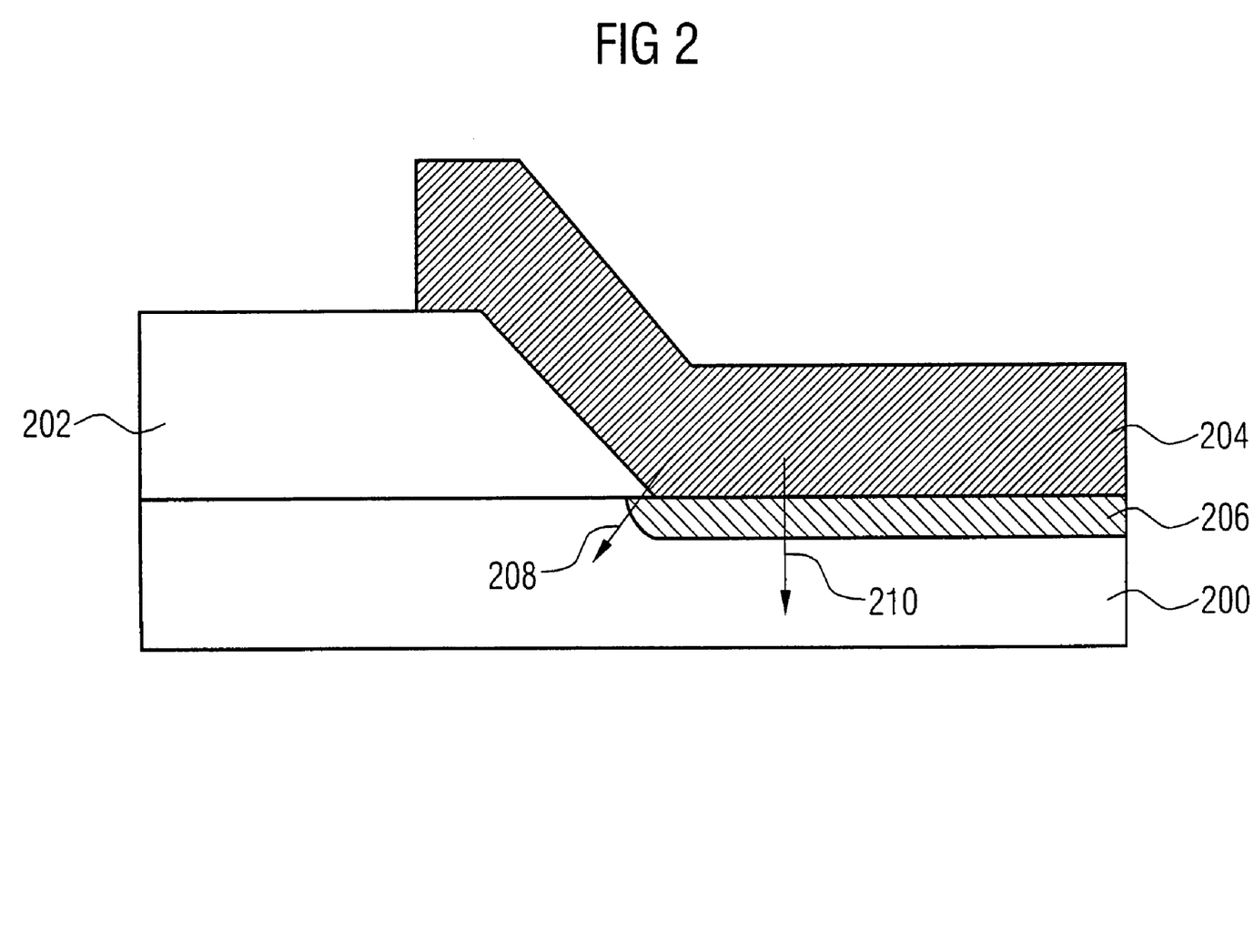
FIG. 2 is a representation of a conventional electronic device in cross-section, the conducting mechanism desired and the location of the non-desired conducting mechanism being depicted at the same time.

FIG. 2 initially shows a semiconductor 200 including, for example, n-doped silicon having a doping concentration of $<10^{18}$ cm$^{-3}$. In addition, an insulator 202, for example silicon dioxide, is arranged on semiconductor 200, so that part of the surface of the semiconductor 200 is covered by the insulator 202. Moreover, a metal area 204 is arranged on the semiconductor 200 and on the insulator 202 such that the metal area 204 covers that area of the semiconductor 200 which is not covered by the insulator 202, and such that the metal area 204 at the same time covers an area of the surface of the insulator 202. Thus, a space-charge zone 206 is formed between the metal area 204 and the semiconductor 200, at the interface between the metal area 204 and the semiconductor 200. The useful current which has been set is given by an emission beyond the potential barrier between the metal area 204 and the semiconductor 200, as is represented by arrow 210 in FIG. 2. A significant portion of the parasitic current is caused by charge carriers which overcome the relatively thin potential barrier at the edge of the insulator, i.e. between the metal area (Schottky metal) 204 and the semiconductor 200. Such an effect (also referred to as tunneling effect) is represented by arrow 208 in FIG. 2. In addition, conducting channels contribute to a parasitic current beyond the edge of the diode by means of minority-charge carriers in the edge area of the space-charge zone (i.e. in that area of the space-charge zone 206 which is arranged in a vicinity of insulator 202).

In addition, leakage currents due to stronger electric fields are also known, which may lead to a reduction of the height of the Schottky barrier at the edge of the diode in the cylindrically or spherically curved portions of the space-charge zone. By suitably processing the Schottky diode, these leakage currents may, however, be kept small in comparison with the useful current. In particular, a pn-diode guard ring is often embedded into the semiconductor 200 to this end, the metal area 204 partly covering the pn-diode guard ring. Hereby, a parasitic current extending beyond the edge of the diode is minimized, since the pn-diode guard ring implements a rise in the potential barrier between the metal area 204 and the semiconductor 200 at the edge area of the Schottky diode.

However, the pn-diode guard ring proves problematic in that, as a consequence, the Schottky diode has an additional portion of parasitic capacitance. The additional portion of parasitic capacitance of the pn-diode guard ring is defined, in particular, by its lateral extension as well as its vertical extension in the semiconductor 200. To be able to use a Schottky diode for high-frequency and/or microwave applications, however, it is necessary to keep the level of the Schottky diode's parasitic capacitances particularly small in relation to the pure space-charge zone capacity of the Schottky diode. In practice it has been found that a pn-diode guard ring which was produced by means of a photolithographic method exhibits lateral and vertical dimensions that are too large, and thus does not exhibit sufficiently small parasitic capacitances, so that those Schottky diodes which are equipped with a pn-diode guard ring are not suitable for high-frequency and/or microwave applications. To manufacture Schottky diodes that will meet the requirements of utilization in high-frequency or microwave applications, the pn-diode guard ring is therefore mostly dispensed with. As a consequence, however, the above-described parasitic currents extending beyond the edge of the diode will occur, which will negatively impact the electrical performance of the device in high-frequency applications.

To sufficiently minimize the arising parasitic currents at the edge of the Schottky diode, e.g. two lithography levels are required for insulating and defining the active Schottky area (i.e. that area of the Schottky diode in which a semiconductor metal contact exists), a guard ring not being provided for in this application (see US 06060757 A). In addition to giving rise to adjustment tolerances negatively impacting the design rules, this also leads to high cost due to the diode being processed at several lithography levels. As a consequence, designs suitable for microwaves very soon reach limits to implementation for technological and cost reasons.

A further approach to minimizing the parasitic currents is to configure guard rings around the active Schottky area (see, for example, US 04261095 A, US 04063964 A, US 03820235 A, US 04209350 A, US 05418185 A, US 05696025 A, US 04414737 A, US 04796069 A, US 04209349 A, US 03907617 A, US 04691435 A, US 05907179 A, US 06191015 A, US 06060757 A). Some of these approaches, however, have the drawback that they partly require high thermal expense, which leads to a deterioration of the series resistance of the cathode terminal due to outdiffusion of dopants from the mostly highly doped cathode terminal into neighboring low-doped areas. Other approaches cannot be employed for high-frequency and/or microwave applications, since the lateral dimensions of the guard ring, and therefore the parasitic capacitances, are too large. Yet other approaches are not suitable for utilization in Schottky diodes, since these approaches lead to dry etching on the semiconductor area which will be active later on, which would compromise the diode properties of this Schottky diode. In addition, in existing technology, the semiconductor 200 is removed outside of the active Schottky area to avoid parasitic capacitances of the terminal contacts of the semiconductor 200 and of the metal area 204. Subsequently, the active Schottky area is defined on the island of the semiconductor arising after the semiconductor material has been removed, this being time-consuming and expensive, however, since two additional lithography levels are required for this process.

Similar problems with regard to parasitic capacitances, as arise with Schottky diodes, also present themselves with further electronic devices, such as highly sensitive sensors of small dimensions.

SUMMARY

Starting from this prior art, the present invention is based on the object of providing an electronic device with improved electrical properties and, at the same time, small geometrical dimensions.

In accordance with a first aspect, the present invention provides an electronic device having:

a substrate;

an insulating layer arranged on the substrate, the insulating layer having an opening in an area of the surface of the substrate;

an active layer arranged within the opening on the surface of the substrate, the active layer including a guard ring in those areas of the surface and of the active layer which are adjacent to the insulating layer; and a contacting layer arranged on an area of the active layer, the contact layer at the same time being adjacent to an area of the guard ring and/or covering an area of the guard ring.

In accordance with the invention, an insulating layer is arranged on the substrate, the insulating layer comprising an opening in an area of the surface of the substrate. Within this opening of the insulating layer, an active layer is arranged on the surface of the substrate. In addition, the active layer comprises a guard ring in those areas of the surfaces of the active layer which are adjacent to the insulating layer. An advantage of the inventive electronic device is that the active layer is limited by the opening in the insulating layer. This lateral limitation of the active layer by the insulating layer at the same time limits (e.g. as a diffusion barrier) the guard ring in the active layer, which guard ring thus has a smaller lateral dimension than it would have without the lateral limitation by the insulating layer. Due to the smaller lateral dimension of the guard ring, the guard ring at the same time has a smaller parasitic capacitance than a guard ring not laterally limited by the insulating layer would have, whereby more favorable electronic properties may be implemented for utilization of the electronic device in applications of high-frequency technology.

In accordance with a preferred embodiment of the present invention, the active layer includes a semiconductor material, and the contact layer includes a metallic material.

In accordance with a further preferred embodiment of the present invention, the active layer includes a semiconductor material with a first type of conductivity, and the guard ring includes a semiconductor material having a second type of conductivity, the second type of conductivity differing from the first type of conductivity.

In accordance with a further preferred embodiment of the present invention, the electronic device further comprises a doping structure arranged in the opening of the insulating layer on the surface of the active layer and at least partly covering the guard ring.

In accordance with a further embodiment of the present invention, the electronic device comprises a doping structure including a semiconductor material exhibiting the second type of conductivity.

In accordance with a further preferred embodiment of the present invention, the material of the doping structure includes a doped oxide.

In accordance with a further preferred embodiment of the present invention, the electronic device includes an auxiliary structure arranged in the opening of the insulating layer on those surfaces of the doping structure which are situated opposite a side flank of the insulating layer and the surface of the guard ring.

In accordance with a further preferred embodiment of the present invention, the material of the auxiliary structure comprises an etching rate with regard to the etching medium which is higher than the etching rate of the material of the doping structure with regard to the etching medium.

In accordance with a further preferred embodiment of the present invention, the substrate includes a contacting area for electrically contacting the active layer.

In accordance with a further preferred embodiment of the present invention, the contacting area is guided to a first external pin in an electrically conductive manner, and the contact layer is guided to a second external pin in an electrically conductive manner, the first external pin being insulated from the second external pin.

In accordance with a second aspect, the invention further provides a method of producing an electronic device, the method including the following steps:

(a) providing a substrate which has an insulating layer;

(b) structuring the insulating layer to form an opening in the insulating layer, by which opening an area of the surface of the substrate is exposed;

(c) applying an active layer having a first type of conductivity to that surface of the substrate which is exposed by the opening in the insulating layer;

(d) applying a doping layer having a second type of conductivity to the surface of the insulating layer, to the side walls of the opening of the insulating layer, and to the surface of the active layer;

(e) structuring the doping layer;

(f) creating a guard ring by introducing dopants from the doping layer into the active layer; and (g) creating a contact layer which is applied to an area of the active layer, the contact layer simultaneously covering an area of the guard ring.

In accordance with a preferred embodiment of the present invention, the method of producing an electronic device includes, after step (g), the following step:

(h) contacting the contact layer for forming an external pin of the contact layer, and contacting the active layer for forming an external terminal region of the active layer.

In accordance with a further preferred embodiment of the present invention, step (b) for producing an electronic device includes the following steps:

(b.1) applying a first cover layer to the surface of the insulating layer;

(b.2) structuring the first cover layer using a mask; and (b.3) forming a structure in the insulating layer using the structure formed in the first cover layer.

In accordance with a further preferred embodiment of the present invention, step (e) for producing an electronic device includes the following steps:

(e.1) applying an auxiliary layer to the surface of the doping layer;

(e.2) structuring the auxiliary layer in at least that area of the auxiliary layer which is arranged on that area of the doping layer which covers the surface of the active layer, to create a mask; and (e.3) forming a structure in the doping layer using the mask produced in the auxiliary layer so as to define a guard ring in the active layer by the structure in the doping layer.

In accordance with a further preferred embodiment of the present invention, steps (e.2) and (e.3) of the method for producing an electronic device include an etching process.

In accordance with a further preferred embodiment of the present invention, the etching process includes, in step (e.2) of the method for producing an electronic device, anisotropic dry-etching with an etchant having an etching rate which is higher, with regard to the material of the auxiliary layer, than an etching rate of the etching medium with regard to the doping layer.

In accordance with a further preferred embodiment of the present invention, the etching process includes, in step (e.3), wet-etching the doping layer with an etchant having a selectivity with regard to the auxiliary layer, so that the auxiliary layer is essentially not attacked by the etching process.

In accordance with a further preferred embodiment of the present invention, step (f) of the method for producing an electronic device includes annealing the electronic device for forming the guard ring, the annealing effecting an outdiffusion of dopants from the structured doping structure into the active layer, whereby a transition is formed between a first type of conductivity and the second type of conductivity which forms the guard ring.

In accordance with a further preferred embodiment of the present invention, step (g) of the method for producing an electronic device includes applying a metal to the surface of the active layer for forming a contact layer.

Hereby, the invention enables the production of guard rings for electronic devices suitable for microwaves, in particular Schottky diodes suitable for microwaves. To this end, a so-called spacer process is used to enable a diffusion source with a lateral extension far below the lithography limit and to avoid, at the same time, placement-error tolerances by using an additional photolithography step. The spacer is preferably structured to comprise two layers, so that the upper layer (auxiliary layer) is preferably dry-etched. The lower layer (doping layer) preferably contains a dopant which creates the guard ring, for example by thermal outdiffusion into the active layer. The lower layer (doping layer) preferably continues to be wet-etched. This serves to achieve the substantial advantage that the active Schottky area is not damaged by kinetic particles (such as in dry-etching, for example). By preferably using a selective epitaxy of the active layer in an insulating window, the outdiffusion, for example, of the guard ring to be produced from the spacer is limited on one side which further reduces the guard ring's capacitance. A further benefit of the epitaxy preferably utilized is to be seen in that unlike the known process of producing an electronic device, no full-area epitaxy layer needs to be removed, for the most part, by etching, since the active layer may now preferably be selectively applied in the opening formed in the insulating layer. This approach saves a process step and avoids etching the buried layer (a contact layer arranged underneath the active layer), which goes into a higher-impedance condition by the previous method. In addition, the present structure may be used for forming a self-aligning silicide.

The invention is thus based on a design of three-fold self-alignment in three ways. The dimensions of the active layer, which is preferably to be formed by epitaxy, of the guard ring and of the active area between the active layer and the contact layer are thus all defined by the opening of the insulating window. Thereby, lithography steps are saved, and adjustment tolerances are avoided. Consequently, in the above-mentioned architecture of three-fold self-alignment, smaller structures are possible, which leads to improved electrical properties of the electronic device to be produced.

BRIEF DESCRIPTION OF THE DRAWINGS

Preferred embodiments of the present invention will be explained in more detail below with reference to the accompanying figures, wherein.

DESCRIPTION OF PREFERRED EMBODIMENTS

In the following description of the preferred embodiments of the present invention, identical reference numerals will be used for the elements having similar effects which are represented in the various drawings.

Figure 1A:
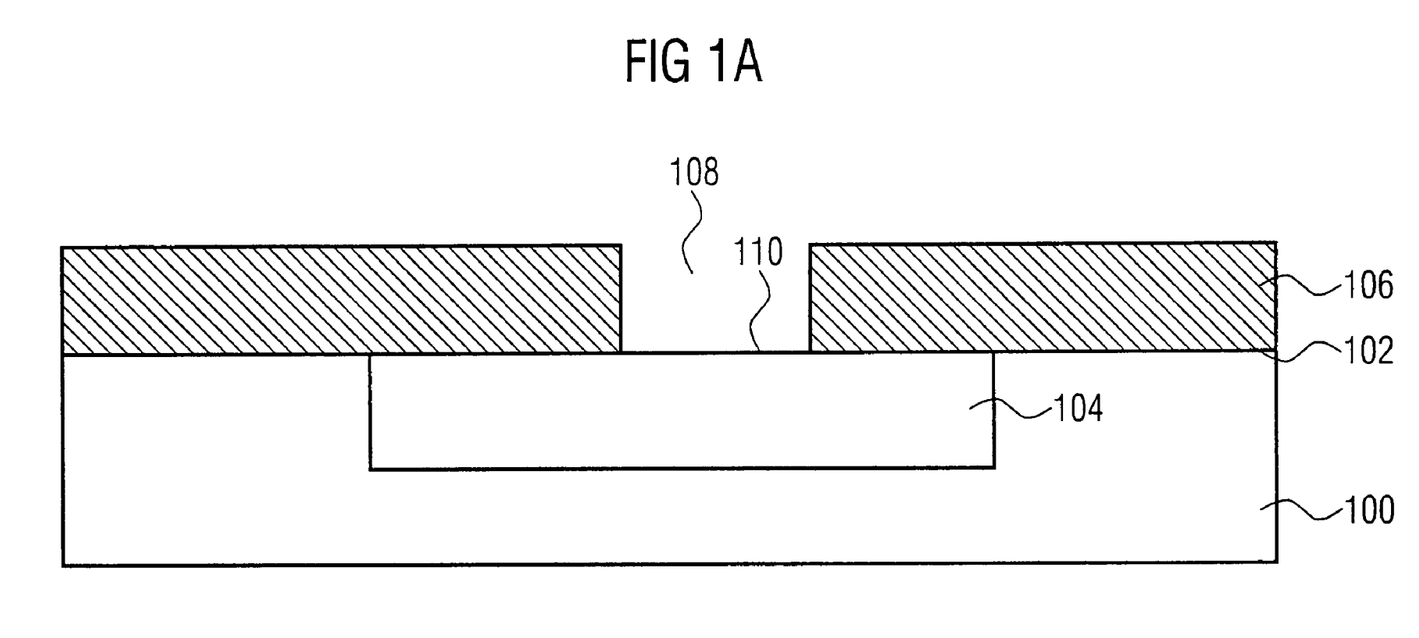
FIGS. 1A to 1F show a first preferred embodiment of the inventive electronic device in cross-section in accordance with the steps of an inventive method of producing an electronic device.

The inventive method of producing an electronic device of a preferred embodiment in the form of a Schottky diode will be explained in more detail below with reference to FIGS. 1A to 1F. FIG. 1A shows a substrate 100 comprising a surface 102. In substrate 100, a highly doped area (buried layer) 104 is produced, preferably by ion implantation or diffusion, which constitutes the later anode contact of the Schottky diode. The doping material used here is preferably a material by which an n-doped semiconductor area is produced. Arsenic, for example, may be considered as a doping material for doping of this kind. The geometrical dimensions of the buried layer 104 should be as small as possible so as to keep later parasitic capacitances at the cathode terminal small. Subsequently, an insulating layer 106 (e.g. silicon dioxide) is deposited on the surface 102 of substrate 100. In addition, an opening 108 is formed across an area 110 of the surface 102 in the insulating layer 106, whereby the buried layer 104 is partially exposed. The structure resulting from these process steps is shown in FIG. 1A.

Figure 1B:
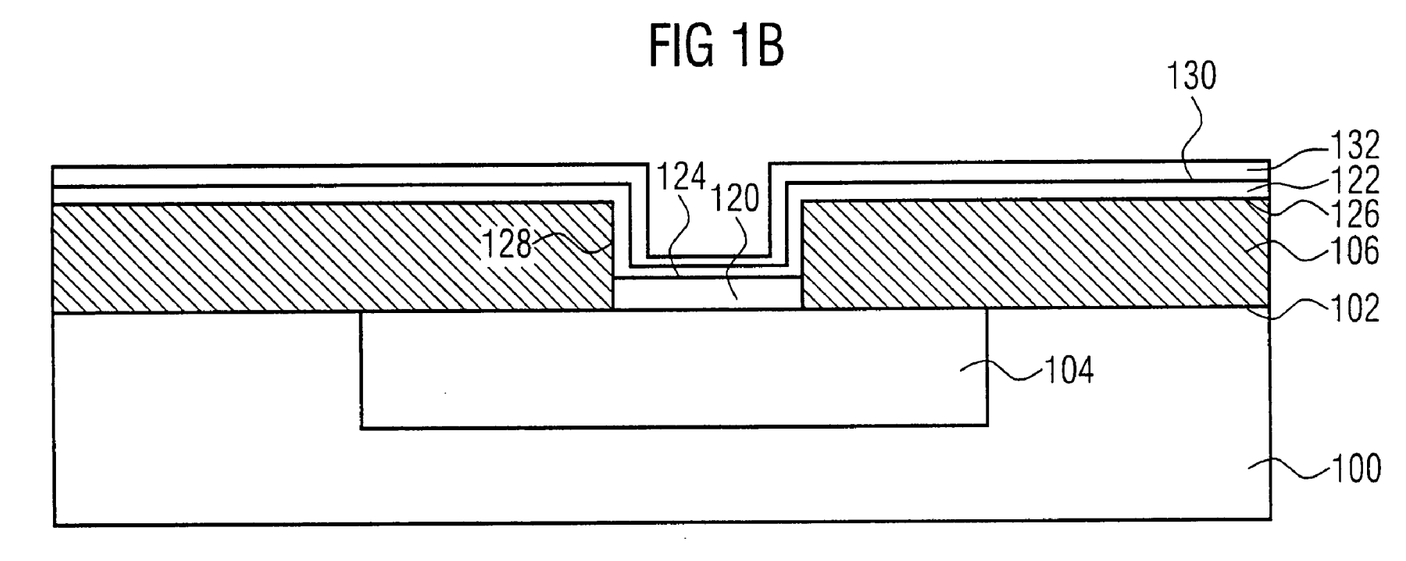
Figure 1C:
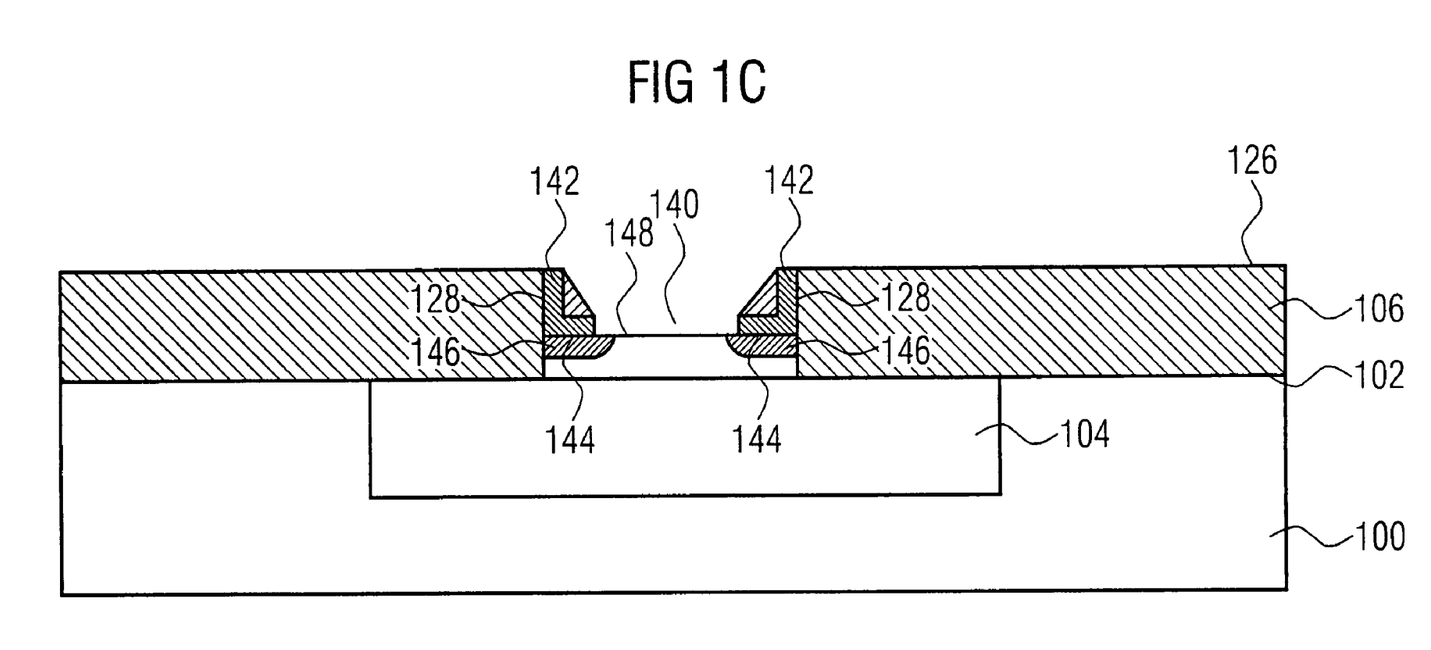

Subsequently, an active layer 120 is selectively deposited on the exposed area 110 of surface 102. The selective deposition here is preferably effected by an epitaxy method for applying, e.g., silicon to the exposed surface 102. The material of the active layer 120 deposited here preferably includes a doping having a first type of conductivity (e.g. n doping). Furthermore, a doping layer 122 is applied to the surface 124 of the active layer 120, to the surface 126 of the insulating layer 106, and to the side walls 128 of the insulating layer 106. The doping layer 122 preferably includes a doped oxide having a second type of conductivity which differs from the first type of conductivity. A doping material that may be considered for the doping layer is, e.g., boron.

Moreover, an auxiliary layer 132 is applied to the surface 130 of the doping layer 122, the material of the auxiliary layer 132 preferably having a higher etching rate in anisotropic dry etching in relation to the material of the doping layer 122. Also, the material of the auxiliary layer 132 should be selected such that the doping layer 122 may be etched, as compared with the auxiliary layer 132, in a highly selective manner with an etchant in wet etching, so that the auxiliary layer 132 is attacked only slightly by to the wet etching of the doping layer 122. In addition, the material of the doping layer 122 should preferably not react with a Schottky metal to be applied in a subsequent step (for example with silicide annealing). The structure resulting from these process steps is shown in FIG. 1B.

The doping layer 122 preferably undergoes wet-chemical etching, wherein only those areas 142 of the doping layer remain which are arranged on the side walls 128 of the insulating layer 106 and on an area 144 of the surface 124 of the active layer 120. Thus, a double spacer, which consists of the remaining structures of the auxiliary layer 132 and the remaining structures 142 of the doping layer 122, is formed on the side walls 128 of the insulating layer 106 and on the area 144 of the surface 124 of the insulating layer 106. Using this double spacer, dopants are, in a subsequent thermal process step, diffused out of the remaining structure 142 of the doping layer 122 and into the active layer 120, whereby the guard ring 146 is formed. Thus, the invention includes the production of a guard ring by the preferable outdiffusion from a double spacer with a diffusion source (doping layer) and preferably a wet-etching mask for the diffusion source (auxiliary layer). Thereby it is possible to produce very narrow guard rings without damaging the area of the future active layer by kinetic particles. The structure resulting from these process steps is represented, by way of example, in FIG. 1C.

Figure 1D:
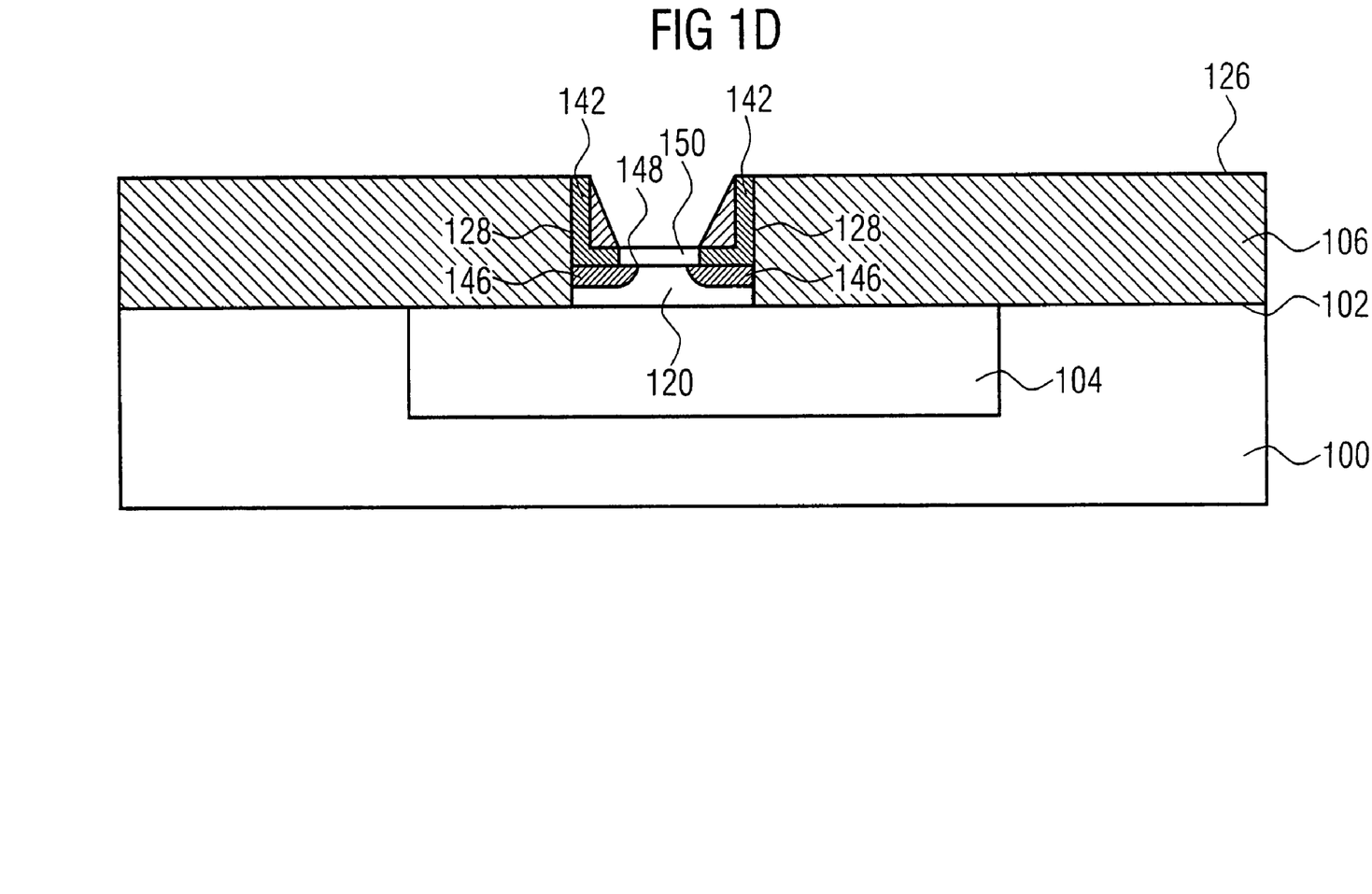

In a subsequent process step, a metallic material is applied to the exposed surface 148 of the active layer 120, e.g. by a sputtering process, whereby a contact layer 150 is formed by means of a self-aligning silicide process. By means of the silicide process, which includes, e.g., applying titanium with subsequent annealing for silicide formation between the active layer 120 and the titanium, high conductivity of the contact layer 150 formed by the silicide is achieved. The structure resulting from this process step is depicted in FIG. 1D.

In such a method of producing, e.g., microwave Schottky diodes, there is thus a three-fold combination of two known self-aligning processes of different technologies (in particular selective application of an active layer 120, preferably by an epitaxy process, and self-aligning application of a silicide as a contact layer 150) and a new self-aligning process (double-spacer diffusion source) for forming a guard ring in the active layer 120.

Figure 1E:
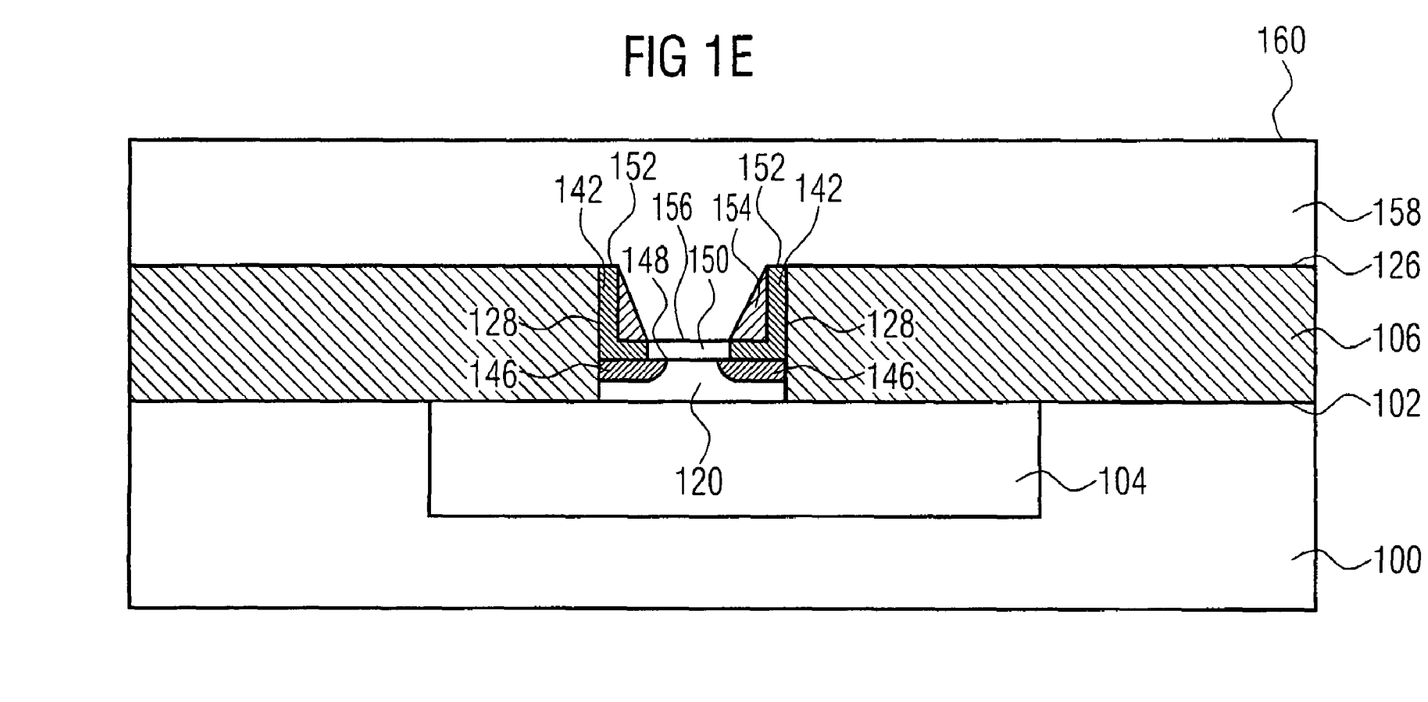

In a subsequent process step, a protective layer 158 is deposited onto the surface 126 of the insulating layer 106, the surface 152 of the doping structure, the surface 154 of the auxiliary structure and the surface 156 of the contact layer 150. The structure resulting from this process step is depicted in FIG. 1E.

Figure 1F:
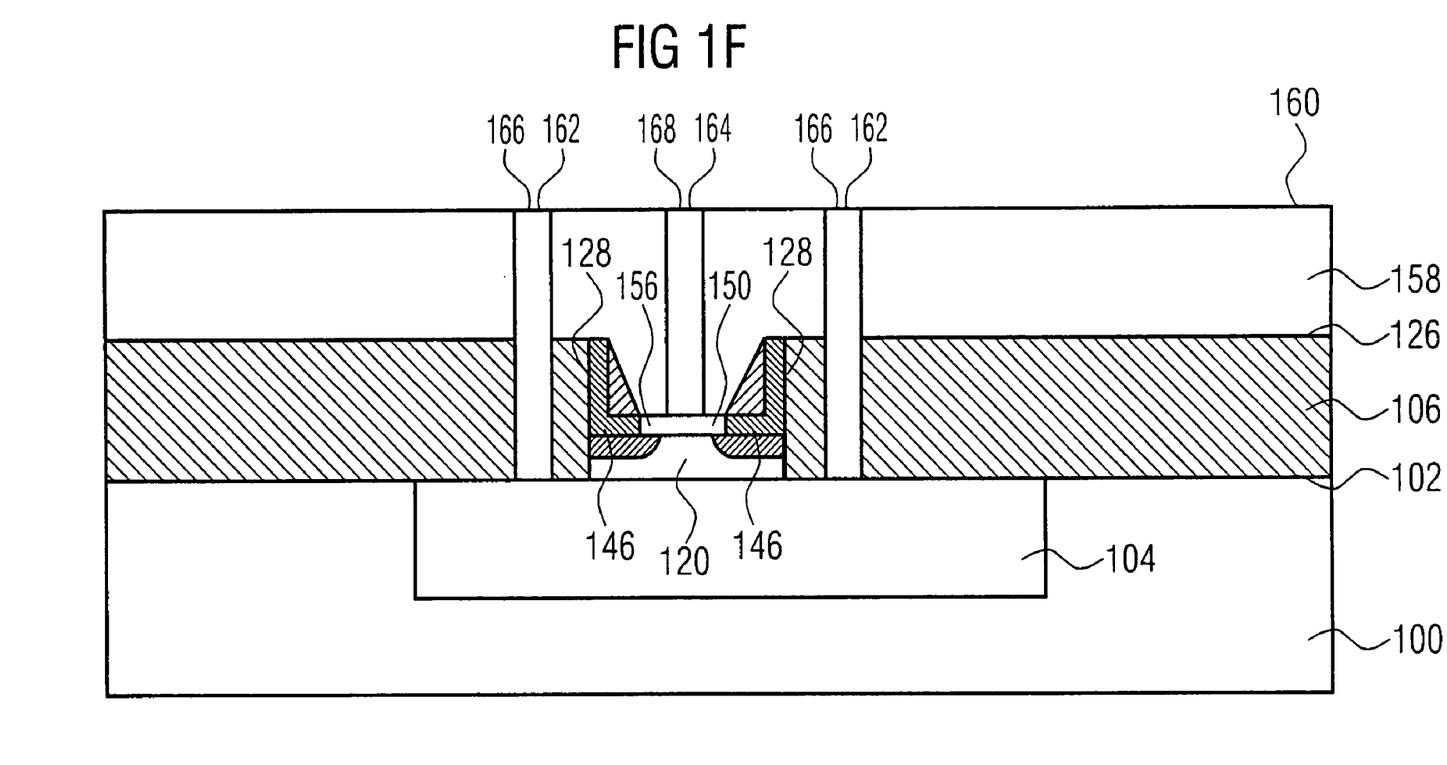

Subsequently, at least one contact hole 162 for contacting the active layer 120 using the buried layer 104, and at least one contact hole 164 for contacting the contact layer 150 are defined on the surface 160 of the protective layer 158. Defining the contact holes 162 and 164 may be effected, for example, by a photolithographic method. Subsequently, the at least one defined contact hole 162 for contacting the active layer 120 is configured such that that area of the protective layer 158 and that area of the insulating layer 106 which are arranged perpendicularly below the contact hole 162 defined on the surface 160 . . . , wherein an area of the buried layer 104 is exposed by the formation of the contact hole 162. In addition, that area of the protective layer 158 which is arranged perpendicularly below the at least one defined contact hole 164 for contacting the contact layer 150 is removed, whereby an area of the surface 156 of the contact layer 150 is exposed. For forming external pins, the contact holes 162 and 164 formed are, in a subsequent process step, conductively filled with a filling material (preferably tungsten), so that at least one external pin 166 for contacting the active layer 120, and at least one external pin 168 for contacting the contact layer 150 are formed on the surface 160 of the protective layer 158, the external pins 166 and 168 preferably terminating flush with the surface 160 of the protective layer 158. The structure resulting from these process steps is depicted in FIG. 1F.

Even though a preferred embodiment of the present invention was explained in more detail above, it is obvious that the present invention is not limited to this embodiment. In particular, the present invention may also be applied to other electronic devices allowing a formation of a guard ring with small lateral dimension by means of a multiply self-aligning process within an insulating window.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LIST OF REFERENCE NUMERALS 100 substrate
102 surface of substrate 100
104 buried layer
106 insulating layer
108 opening in the insulating layer 106
110 area, of surface 102, in which the device is formed
120 active layer
122 doping layer
124 surface of active layer 120
126 surface of insulating layer 106
128 side walls of insulating layer 106
130 surface of doping layer 122
132 auxiliary layer
140 area of the active Schottky region
142 doping structure
144 area of the surface 124 which defines the guard ring
146 guard ring
148 exposed surface of active layer 120
150 contact layer
152 surface of doping structure 142
154 surface of the auxiliary structure
156 surface of contact layer 150
158 protective layer
160 surface of protective layer 158
162 contact hole for contacting active layer 120
164 contact hole for contacting contact layer 150
166 first external pin for contacting active layer 120
168 second external pin for contacting contact layer 150
200 semiconductor
202 insulator
204 metal area
206 space-charge zone
208 parasitic current beyond the etched area of the diode
210 emission beyond the potential barrier

What is claimed is:

1. An electronic device comprising:
a substrate;
an insulating layer arranged on the substrate, the insulating layer having an opening in an area of a surface of the substrate;
an active layer arranged within the opening on the surface of the substrate, the active layer including a guard ring in a first area of the active layer which is adjacent to the insulating layer, wherein the active layer and the guard ring have side faces adjoining to a side face of the insulating layer such that the active layer and the guard ring are laterally bounded by the insulating layer;
a contacting layer arranged on an area of the active layer, the contact layer being adjacent to at least a portion of the guard ring; and
a doping structure arranged in the opening of the insulating layer on the surface of the active layer and at least partially covering the guard ring.

2. The electronic device as claimed in claim 1, wherein the active layer includes a semiconductor material, and wherein the contact layer includes a metallic material.

3. The electronic device as claimed in claim 2, wherein the semiconductor material of the active layer comprises a first type of conductivity, and wherein the guard ring includes a semiconductor material having a second type of conductivity which differs from the first type of conductivity.

4. The electronic device as claimed in claim 1, wherein:
the active layer comprises a semiconductor material having a first type of conductivity;
the guard ring includes a semiconductor material having a second type of conductivity which differs from the first type of conductivity; and
the doping structure includes a semiconductor material comprising the second type of conductivity.

5. The electronic device as claimed in claim 4, wherein the doping structure includes a doped oxide.

6. The electronic device as claimed in claim 4, further comprising:
an auxiliary structure arranged in the opening of the insulating layer on the surface of the doping structure which is disposed opposite a side flank of the insulating layer and a surface of the guard ring.

7. The electronic device as claimed in claim 6, wherein the auxiliary structure exhibits an etching rate, with regard to an etching medium, which is higher than the etching rate of the material of the doping structure with regard to the etching medium.

8. The electronic device as claimed in claim 1, wherein the substrate includes a contacting area configured to provide electrical contact to the active layer.

9. The electronic device as claimed in claim 8, wherein the contacting area is guided to a first external pin in an electrically conductive manner, and wherein the contacting area is guided to a second external pin, which is insulated from the first external pin, in an electrically conductive manner.

10. The electronic device as claimed in claim 1, wherein the active layer includes an active region; and
wherein the doping structure is arranged to at least partially cover the guard ring and to not cover the active region of the active layer.

* * * * *